US009000408B2

(12) United States Patent
Kostylev et al.

(10) Patent No.: US 9,000,408 B2
(45) Date of Patent: Apr. 7, 2015

(54) MEMORY DEVICE WITH LOW RESET CURRENT

(75) Inventors: Sergey Kostylev, Bloomfield Hills, MI (US); Tyler Lowrey, West Augusta, VA (US); Wolodymyr Czubatyj, Warren, MI (US)

(73) Assignee: Ovonyx, Inc., Sterling Heights, MI (US)

(*) Notice: Subject to any disclaimer, the term of this patent is extended or adjusted under 35 U.S.C. 154(b) by 1357 days.

(21) Appl. No.: 11/871,761

(22) Filed: Oct. 12, 2007

(65) Prior Publication Data
US 2009/0095951 A1    Apr. 16, 2009

(51) Int. Cl.
*H01L 45/00*    (2006.01)

(52) U.S. Cl.
CPC ........... *H01L 45/06* (2013.01); *H01L 45/1233* (2013.01); *H01L 45/1246* (2013.01); *H01L 45/1253* (2013.01); *H01L 45/1293* (2013.01); *H01L 45/141* (2013.01); *H01L 45/143* (2013.01); *H01L 45/148* (2013.01); *H01L 45/1675* (2013.01); *H01L 45/1691* (2013.01)

(58) Field of Classification Search
CPC .................. G11C 13/0004; G11C 11/5678
USPC ............. 257/3, E45.002, 2, 4; 365/163
See application file for complete search history.

(56) References Cited

U.S. PATENT DOCUMENTS

| 5,714,768 | A  | * | 2/1998 | Ovshinsky et al. | ............. 257/40 |
|---|---|---|---|---|---|
| 5,825,046 | A  | * | 10/1998 | Czubatyj et al. | ................ 257/2 |
| 6,795,338 | B2 | * | 9/2004 | Parkinson et al. | ............ 365/163 |
| 7,589,364 | B2 | * | 9/2009 | Asano et al. | ................. 257/246 |
| 7,902,536 | B2 | * | 3/2011 | Czubatyj et al. | ................ 257/2 |
| 2004/0109351 | A1 | * | 6/2004 | Morimoto et al. | ............ 365/171 |
| 2005/0127348 | A1 | * | 6/2005 | Horak et al. | ...................... 257/3 |
| 2005/0173691 | A1 | * | 8/2005 | Lee et al. | .......................... 257/2 |

* cited by examiner

*Primary Examiner* — Jerome Jackson, Jr.
*Assistant Examiner* — Paul Budd
(74) *Attorney, Agent, or Firm* — Honigman Miller Schwartz and Cohn LLP

(57) ABSTRACT

An electronic device includes a first electrode and a second electrode. The device also includes a resistive material between the first and second electrodes. An active material is between the first electrode and the resistive material. The active material is in electrical communication with the first electrode and the active material is in electrical communication with the second electrode through the resistive layer.

27 Claims, 4 Drawing Sheets

MEMORY DEVICE WITH LOW RESET CURRENT

TECHNICAL FIELD

The embodiments described herein are generally directed to memory devices including a phase-change material or electronic switching devices.

BACKGROUND

Non-volatile memory devices are used in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more insulators.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structured states have different values of resistivity and therefore, each state can be determined by electrical sensing. Typical materials suitable for such applications include those utilizing various chalcogenide materials. Unlike certain known devices, these electrical memory devices typically do not use field-effect transistor devices as the memory storage element. Rather, they comprise in the electrical context, a monolithic body of thin film chalcogenide material. As a result, very little area is required to store a bit of information, thereby providing for inherently high-density memory chips.

The state change materials are also non-volatile in that, when set in either a crystalline, semi-crystalline, amorphous, or semi-amorphous state representing a resistance value, that value is retained until reprogrammed, as that value represents a physical state of the material (e.g., crystalline or amorphous). Further, reprogramming requires little energy to be provided and dissipated in the device. Thus, phase-change memory materials represent a significant improvement in non-volatile memory technology.

However, present phase-change memories may include losses in heat and may require large programming volumes of the phase-change material. The heat losses may be due to heat transfer to adjacent memories (in the context of a memory array) or to adjacent structures such as electrodes and interconnects. Large programming volumes may be attributed to electrode structures that spread current over a larger area, rather than concentrating the current to a smaller region. Additionally, present devices experience degradation over time due to atomic migration between the dissimilar materials of the phase-change material and the electrode material.

Therefore, a need has arisen to produce an improved phase-change memory device that may provide for reduced programming currents. It is also desirable to reduce memory degradation over time.

SUMMARY

A memory device includes a first electrode and a second electrode. The device also includes a resistive material between the first and second electrodes. An active material is between the first electrode and the resistive material. The active material is in electrical communication with the first electrode and the active material is in electrical communication with the second electrode through the resistive layer.

A switching device includes a first electrode and a second electrode. The device also includes a resistive material between the first and second electrodes. An active material is between the first electrode and the resistive material. The active material is in electrical communication with the first electrode and the active material is in electrical communication with the second electrode through the resistive layer.

Another memory device may include a first electrode having a first contact region and a first insulator deposited over the first electrode. The first insulator may include a hole therethrough defining the first contact region. An active layer may be deposited over the first contact region and the first insulator. A resistive material may be deposited over the active layer. Additionally, a second electrode may be deposited over the resistive material where the first and second electrodes are in electrical communication with the active layer and the second electrode is in electrical communication with the active layer through the resistive layer.

Another switching device may include a first electrode having a first contact region and a first insulator deposited over the first electrode. The first insulator may include a hole therethrough defining the first contact region. An active layer may be deposited over the first contact region and the first insulator. A resistive material may be deposited over the active layer. Additionally, a second electrode may be deposited over the resistive material where the first and second electrodes are in electrical communication with the active layer and the second electrode is in electrical communication with the active layer through the resistive layer.

Also described is a method for making a memory device. The method includes providing a substrate and forming a first conductive material over the substrate. The method also includes forming a first insulator material over the first conductive layer and forming a pore through the first insulator to expose a portion of the first conductive layer. The method further includes forming an active material in the pore, forming a resistive material over the active material, and forming a second conductive material over the resistive material.

Also described is a method for making a switching device. The method includes providing a substrate and forming a first conductive material over the substrate. The method also includes forming a first insulator material over the first conductive layer and forming a pore through the first insulator to expose a portion of the first conductive layer. The method further includes forming an active material in the pore, forming a resistive material over the active material, and forming a second conductive material over the resistive material.

BRIEF DESCRIPTION OF THE DRAWINGS

The features and inventive aspects will become more apparent upon reading the following detailed description, claims, and drawings, of which the following is a brief description:

DETAILED DESCRIPTION

Figure 1:
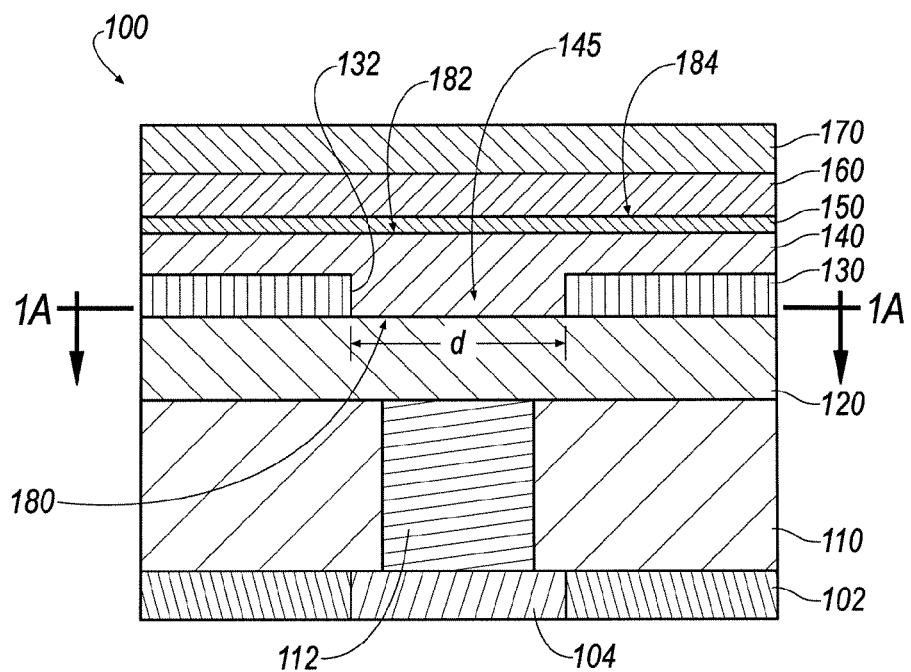
FIG. 1 is a cross-sectional view of a phase-change memory device.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

Embodiments of an electronic device, which may include memory devices and/or switching devices are discussed herein. The electronic device is discussed herein in the context of a memory device. However, one skilled in the art recognizes that the electronic device may be employed as a memory device and/or a switching device. Thus, the memory device and switching device are interchangeable. The electronic device includes an active material that may be configured as a phase-change material. A phase-change layer or switching layer is provided between a first electrode and a resistive layer which in turn has a second electrode opposite the phase-change layer. The device may be addressed using the first and second electrodes, which are in electrical communication with the phase-change layer or switching layer. However, the second electrode is in electrical communication with the phase-change layer through a thin resistive layer which may be a silicon nitride ($Si_3N_4$) material that is deposited to a thickness of about 20 Å (twenty angstroms) to about 40 Å (forty angstroms) in a film.

In one aspect, the embodiments discussed herein improve device performance by reducing reset current for a phase-change device as compared to prior art devices. The reset current is decreased in one example by decreasing the heat-loss from the device where the resistive layer acts as a thermal insulator to reduce thermal energy from leaking to adjacent structures. By reducing heat loss, less current is required for the reset operation. In another example, the reset current is reduced by reducing the active volume of programmable active material. This may be accomplished by increasing the device resistance through the use of the resistive film layer. Other examples show how the resistive layer increases the lifetime of the memory device by reducing atomic migration degradation.

The memory device may be written to and read in a manner described in U.S. Pat. No. 6,687,153, issued Feb. 3, 2004, to Lowrey, for "Programming a Phase-Change Material Memory", which is hereby incorporated by reference in its entirety, as well as other methods known to those skilled in the art. The memory device may also be configured as an array of devices such that a high-density memory array is created. The switching device may have the operational characteristics of an Ovonic Threshold Switching device, such as the ones described in U.S. Pat. Nos. 5,543,737; 5,694,146; 5,757,446; and 6,967,344; the disclosures of which are hereby incorporated by reference in their entirety. The switching material is generally a material having a resistive state and a conductive state, where a transformation between the resistive state and conductive state may be induced upon application of an electric field, electric current or voltage across the material. In a preferred embodiment, the switching material is reversibly transformable between the resistive and conductive states.

In yet another aspect, the memory device may be configured to provide multi-level storage. That is to say, the memory device may have a plurality of discrete and identifiable states which allow for multi-bit storage in a single memory element, rather than a common binary storage element. The phase-change memory material may be configured, along with adjacent structures, to facilitate multi-level storage in an improved manner.

As discussed herein, the term "electrical communication" is intended to mean that two or more structures allow electrical current to flow from one structure to another. In one example, electrical communication may arise from direct contact of one material to another. In another example, electrical communication may include an intermediate structure such as a resistive layer, a carbon layer, a phase-change material, and/or a metal structure that facilitates or enables electrical current flow between structures. Such a structure, in the example of a carbon layer, may be desirable when the carbon layer is used as an etch-stop in a fabrication process as well as to modify the resistivity of a contact. Alternatively, the structure may also reduce atomic migration between two dissimilar materials while still allowing electrical current to flow. Thus, the term electrical communication is not limited merely to two physically contacting structures.

FIG. 1 is a cross-sectional view of a phase-change memory device 100. Memory device 100 includes a first electrode 120, a phase-change layer 140, a resistive layer 150, and a second electrode 160. A first insulator 130 generally separates first electrode 120 from phase-change layer 140, but also defines an active region 145 near where phase-change layer 140 generally passes current from first electrode 120. Active region 145 typically includes a portion of active material (of phase-change layer 140) that is located between first and second electrodes 120, 160. A first contact region 180 and a second contact region 182 carry device current through phase-change layer 140 when performing a programming operation. A third contact region 184 provides electrical communication with resistive layer 150 and second electrode 160.

Phase-change memory device 100 is typically constructed upon supporting structures that may include a lower isolation layer 102, a lower conductive layer 104, a lower interconnect insulator 110, and a lower interconnect 112. Lower isolation layer 102 may be made of, for example, $SiO_2$ (silicon dioxide) or other insulators, and is readily deposited by techniques such as chemical vapor deposition (CVD), physical vapor deposition (PVD), or formed by thermal oxidation of silicon. In general, lower isolation layer 102 is optional but may be provided to electrically insulate and thermally insulate memory device 100 from other circuitry that may be constructed below memory device 100.

Lower interconnect 112, first electrode 120 and second electrode 160 may be made of a metal, metal alloy, metal-containing compound (e.g. Ti, TiAlN, TiSiN, TiN, MoN) or carbon and may be a homogeneous, layered, or composite material. Lower interconnect 112 electrically connects memory device 100 to external circuitry (not shown) for the reading and writing operations of memory device 100. Lower interconnect insulator 110 may be made of $SiO_2$ (silicon dioxide), SiN (silicon nitride), other oxide or nitride, or other insulators, and electrically and thermally insulates lower interconnect 112 from other interconnects and adjacent structures.

First insulator 130 is deposited as a layer and an opening or pore is formed therein into which a portion of phase-change layer 140 may be formed. First insulator 130 generally insulates portions of phase-change layer 140 away from active region 145 from lower electrode 120 and other structures. Moreover, lower interconnect insulator 110 provides a generally planar surface along with lower interconnect 112 that allows for a substantially planar deposition of first electrode. During production, lower interconnect insulator 110 and lower interconnect 112 may be processed to a flat surface (e.g., a generally planar surface) using a chemical mechanical polishing (CMP) process. The finished surface of lower interconnect insulator 110 is generally planar and then receives first electrode 120. Active region 145 is substantially bounded by a pore periphery 132 that defines a hole through first insulator 130. As discussed herein, a pore and a hole are used interchangeably. Moreover, one skilled in the art will recognize that a pore and hole may include configurations other than round shapes and may further include other geometries (e.g., a trench, channel, via, generally circular, annular, or other opening). First insulator 130 further provides electrical insulation and thermal insulation surrounding active region 145.

The portion of phase-change layer 140 that is between first electrode 120 and second electrode 160 and inside the pore region, e.g. region 145, provides an active area for the memory storage functionality. An analogous switching device may be achieved by substituting a layer of switching material, such as a threshold switching material, for phase-change layer 140. As discussed below in detail, resistive layer 150 is between phase-change layer 140 and second electrode 160. Resistive layer 150 changes the electrical and physical characteristics of memory device 100, as well as reduces device degradation over time.

Typically, the "reset" state is where active-region 145 (or a portion thereof) of the phase-change material of phase-change layer 140 is in a substantially amorphous state. Alternatively, in a "set" state active-region 145 may be in a substantially crystalline state. Surrounding portions of phase-change layer 140 may be substantially crystalline, which allows for improved conductivity with first and second electrodes 120, 160. When reading phase-change memory device 100, a current is passed through active-region 145 via first and second electrodes 120, 160 and the conductivity (or resistivity) is compared with a threshold to determine the "set" or "reset" state. In general, the resistivity of the phase-change material is greater when active-region 145 is in the substantially amorphous state and is reduced when in the substantially crystalline state. Assignment of logic states (used with circuits and/or devices that use phase-change memory device 100) to the "set" and "reset" states may be arbitrary. Assigning a logic "1" to the substantially crystalline state and a logic "0" to the substantially amorphous state is one example. Conversely, the opposite may be assigned.

In order for phase-change memory device 100 to change states, electrical current is formed between first and second electrodes 120, 160 through active-region 145 and resistive layer 150. The current heats the active material (e.g., the phase-change material) to a temperature at or above its melting point. Once melting is achieved, active-region 145 may be thermally quenched to a produce a substantially amorphous state, slowly cooled to produce a substantially crystalline state, or cooled at various intermediate rates to produce a state having variable degrees of crystalline and amorphous phase content.

Resistive layer 150 promotes the objective of reducing the reset current by providing a breakdown capability. The presence of intact resistive layer 150 in the device structure increases the resistance between first electrode 120 and second electrode 160. During initial operation of the device, a voltage is applied between first electrode 120 and second electrode 160. When resistive layer 150 is intact, the current passing between first electrode 120 and second electrode 160 is low and may be insufficient to program phase change material within active region 145. When the voltage between first electrode 120 and second electrode 160 is raised above a critical value, however, resistive layer 150 may be punctured by means of dielectric breakdown to create a small area conductive path between first electrode 120 and second electrode 160 that has a restricted volume. By controlling the voltage and/or current, the region of puncture can be controlled and made to be only a fractional portion of resistive layer 150. The process of puncturing resistive layer 150 may be referred to as a "breakdown effect" and the area of puncture can be on the scale of several angstroms to tens or hundreds or thousands of angstroms. In one embodiment, the area of puncture is less than the area of contact region 180 between first electrode 120 and the portion of the phase-change material in the pore or opening formed in dielectric 130. In another embodiment, the area of puncture is less than 50% of the area of contact region 180 between first electrode 120 and the portion of the phase-change material in the pore or opening formed in dielectric 130. In yet another embodiment, the area of puncture is less than 25% of the area of contact region 180 between first electrode 120 and the portion of the phase-change material in the pore or opening formed in dielectric 130. In still another embodiment, the area of puncture is less than 10% of the area of contact region 180 between first electrode 120 and the portion of the phase-change material in the pore or opening formed in dielectric 130. In a further embodiment, the area of puncture is less than 2% of the area of contact region 180 between first electrode 120 and the portion of the phase-change material in the pore or opening formed in dielectric 130. In one embodiment, the punctured region has a cross-sectional dimension less than 1000 Å. In another embodiment, the punctured region has a cross-sectional dimension less than 300 Å. In yet another embodiment, the punctured region has a cross-sectional dimension less than 100 Å. In still another embodiment, the punctured region has a cross-sectional dimension less than 50 Å. In a further another embodiment, the punctured region has a cross-sectional dimension less than 25 Å. Through the breakdown effect, the exposed area of second electrode 160 can be reduced, current flow between first electrode 120 and second electrode 160 will preferentially occur through the punctured portion of resistive layer 150, and the overall programmed volume of phase-change material between first electrode 120 and second electrode 160 can be reduced. The reduction in programmed volume leads to a reduction in the reset current.

In the embodiment of FIG. 1, resistive layer 150 is in contact with second electrode 160. In one embodiment, second electrode 160 is an anode. In another embodiment, second electrode 160 is a cathode. In still other embodiments, resistive layer 150 is in contact with first electrode 120, where first electrode 120 may be a cathode or an anode. In further embodiments, resistive layer 150 is positioned between first electrode 120 and second electrode 160 and is not in contact with either first electrode 120 or second electrode 160.

In aiding the objective of reducing the programming current, the thermal insulative properties of resistive layer 150 may be beneficial. When programming active region 145 of phase-change layer 140, heat may escape from active region 145 through phase-change layer 140 and into second electrode 160. The heat loss through second electrode 160 decreases the performance of memory device 100 because more current is required to heat active region 145 to a melting temperature needed to provide for an amorphous state. That is to say, a relatively higher reset current is required for devices that allow heat to escape to adjacent structures because the heat required to transition phase-change layer 140 is not concentrated and held at active region 145, but rather is lost to surrounding parts of the device structure. These heat losses represent an energy loss that must be compensated with a higher programming energy. The presence of the unpunctured portion of resistive layer 150 provides a thermal barrier to heat loss to second electrode 160 and promotes retention of the programming energy within the programmed volume of phase change material 140. As a result the efficiency of memory device 100 is improved because the reset current is reduced.

As discussed above, resistive layer 150 may behave as a thermal insulator. In another aspect, resistive layer 150 may behave as an electrically resistive element between phase-change layer 140 and second electrode 160. Because resistive layer 150 is placed between phase-change layer 140 and second electrode 160, it may be considered an electrical component providing electrical communication between them. By selecting a material for resistive layer 150 that is electrically resistive (e.g. silicon nitride ($Si_3N_4$), other nitride, silicon dioxide, other oxide, or other insulator), dissipation of electrical current away from the punctured portion of resistive layer 150 is reduced and the current is more effectively localized in a restricted volume of phase change material 140. Electrical losses are accordingly minimized and the programming current is more efficiently utilized to effect the desired programming event within phase change material 140. This results in reduced power consumption and a reduced volume of active region 145.

In operation, the device resistance changes as active region 145 is programmed to a crystalline, amorphous or any of the plurality of mixed crystalline-amorphous states. The amount or programming energy required to achieve any of the programming states is reduced when resistive layer 150 is included in the device structure relative to a corresponding device structure lacking resistive layer 150.

In an embodiment, resistive layer 150 may include a silicon nitride ($Si_3N_4$) material that is deposited to a thickness of about 20 Å (twenty angstroms) to about 40 Å (forty angstroms) as a film. Such a configuration for resistive layer 150 has been shown experimentally to reduce reset current density by about 30% (thirty percent). It is also contemplated that other insulators may be used rather than silicon nitride ($Si_3N_4$). For example, insulators and materials suitable for use with resistive layer 150 may include, but are not limited to, silicon dioxide ($SiO_2$), alumina ($Al_2O_3$), other oxide materials, carbide materials, nitride materials, aerogels, xerogels and their derivatives and composites. The film of resistive layer 150 may be deposited, for example, by chemical vapor deposition (CVD), physical vapor deposition (PVD) or evaporation. In addition to the electrical and thermal properties of resistive layer 150, the layer may also act as an etch-stop that is used to prevent further patterning of existing lower features in subsequent manufacturing processes. For example, resistive layer 150 may be used to protect phase-change layer 140 from damage if second electrode 160 is patterned (e.g., using etching).

As discussed above, the reset current is reduced due to better control of and an ability to reduce the programmed volume of active region 145. Resistive layer 150 also helps to insulate active region 145 from heat loss to adjacent structures. These properties assist in generally decreasing the reset current required for memory device 100 by reducing the amount of heat required to reset or otherwise modify the structural state or phase of active region 145. Moreover, the current requirements for reset are reduced because the heat is used more efficiently when resistive layer 150 thermally insulates active region 145 from second electrode 160. Thus, memory device 100 operates more efficiently because the reset current is reduced and the volume of active region 145 is reduced.

In addition to the improvements in general device operation, the cycle-life of memory device 100 is improved with the addition of resistive layer 150. Depending upon the choice of materials for resistive layer 150, the film may improve device cycle-life by providing a barrier to metal migration of phase-change layer 140 and second electrode 160. In an example, silicon nitride ($Si_3N_4$) is used for resistive layer 150 which provides a barrier during the operation of memory device 100 between phase-change layer 140 and the metal (or other conductive material) of second electrode 160. Typically, where a metal such as copper, aluminum, tungsten, etc. are used for second electrode 160, the phase-change material and the material of second electrode 160 may interact over time and cause the electrical communication therebetween to be reduced in effectiveness. Typically, when current passes through memory device 100 it is susceptible to metal or other atomic migration between structures in contact with each other. In cases where current density is high (e.g., a reset current) then the chance of atomic migration is increased. Thus, by reducing reset current migration may also be reduced.

In general, the atomic migration of prior art devices allows atomic species from second electrode 160 to enter into phase-change layer 140 and/or allows atomic species from phase-change layer 140 to enter into second electrode 160, which may modify the electrical, electro-chemical or electro-mechanical properties of phase-change layer 140 and/or second electrode 160. In an example where resistive layer 150 is not present, the migration of undesired atoms from second electrode 160 into phase-change layer 140 or from phase-change layer 140 into second electrode 160 may increase the reset current requirements for the device. As a result, the device may have increased current requirements for programming operations. Alternatively, the properties for reading and/or writing the device may not be within tolerance for single or multi-level programming.

With respect to the cycle-life of a memory device, atomic migration or diffusion may degrade electrical communication of the electrodes with the phase-change material. Moreover, the device resistance may change over time which could lead to unpredictable operations and/or failure of the device. The addition of resistive layer 150 may improve the cycle-life by buffering the possible degradation of phase-change layer 140 and second electrode 160. The migration issue is mitigated by removing the direct metal-to-phase-change interface as well as reducing the reset current for memory device 100. Thus, resistive layer 150 also generally behaves as a barrier to atomic migration or diffusion between phase-change layer 140 and second electrode 160.

In general, second electrode 160 may be a conductive metal or metal alloy film that is deposited over resistive layer 150.

Second electrode 160 may also be patterned to electrically connect memory device 100 to external circuitry (not shown) for the reading and writing operations of memory device 100. When memory device 100 is in operation, second electrode 160 and first electrode 120 may be used to read and write memory device 100.

First electrode 120 may be a conductive metal film that is deposited over lower interconnect insulator 110 and lower interconnect 112. When constructed, first electrode 120 is typically a metal deposited by chemical vapor deposition (CVD) or physical vapor deposition (PVD). The substrate may be a base wafer and may including circuitry, structure or underlying layers.

First contact region 180 is generally a region of electrical communication with phase-change layer 140. The electrical communication may be direct contact of first contact region 180 to phase-change layer 140. Alternatively, there may also be a conductive layer between them. For example, a carbon layer (not shown) may be deposited between phase-change layer 140 and first contact region 180 that provides conductivity therebetween but prevents physical contact. Such a carbon layer may be used as an etch-stop and/or to reduce migration or diffusion between phase-change layer 140 and first electrode 120. Additionally, a carbon layer may be provided therebetween to modify the resistance between first contact region 180 and phase-change layer 140. When a conductive layer is placed between phase-change layer 140 and first contact region 180, they remain in electrical communication through the conductive layer and read and write operations may be performed.

In general, additional conductive layers (e.g., carbon) may be used between bottom and/or contact regions 180, 182, 184 to modify contact resistance, reduce migration (e.g., provide a atomic migration barrier), and provide an etch stop, etc. In one example, first contact region 180 directly interfaces phase-change layer 140 to provide electrical communication. In another example, a conductive layer such as a carbon layer (not shown) may be provided between first contact region 180 and phase-change layer 140. In another example, second contact region 182 and third contact region 184 provide electrical communication between phase-change layer 140 and second electrode 160.

Second electrode 160 may be positioned opposite first contact region 180 on the opposite side of phase-change layer 140. Second electrode 160 may be formed as a layered structure that is larger in contact area (e.g., third contact region 184) than first contact region 180. Alternatively, second electrode 160 may be formed as a ring structure or a circular structure that may be similarly sized, or larger, in area to first contact region 180. Second electrode 160 may be configured as a square region, a rectangular region, or other geometries.

When memory device 100 is in operation, current flows from lower interconnect 112 through first electrode 120 to first contact region 180. Current then flows from first contact region 180 through phase-change layer 140 (including active region 145) to resistive layer 150 and second contact region 182. After breakdown of resistive layer 150 occurs, current then flows primarily through the punctured portion of resistive layer 150 to second electrode 160 where it may further connect to external circuitry.

Phase-change layer 140 is provided as a layer of phase-change memory or switching material, such as a chalcogenide, and is in electrical communication with first electrode 120 and second electrode 160 (primarily through the punctured portion of resistive layer 150). Phase-change layer 140 may be a Ge—Sb—Te ternary alloy such as a $Ge_2Sb_2Te_5$ chalcogenide alloy (hereinafter referred to as GST225). As used herein, the term phase-change memory material refers to a material capable of changing between two or more phases that have distinct electrical characteristics. Embodiments of phase-change materials include chalcogenide materials and pnictide materials. Phase-change layer 140 preferably includes at least one chalcogen element selected from Te, S and Se, and may further include one element selected from the group consisting of Ge, Sb, Bi, Pb, Sn, As, Si, P, O, N, In and mixtures thereof. Suitable phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge_{15}Sb_2S_2$ and quaternary Te—Ge—Sb—S compositions. In switching device embodiments of the instant invention, the switching material may be selected from those compositions among the foregoing that demonstrate little or no tendency to undergo a structural or phase transformation under the conditions of device operation. The switching materials are preferably chalcogenide or pnictide materials that are amorphous and remain amorphous under the current and voltage conditions used to induce the switching transformation.

The resistivity of chalcogenides generally varies by two or more orders of magnitude when the chalcogenide material changes phase from an amorphous state (more resistive) to a polycrystalline state (less resistive). Electrodes 120, 160, deliver an electric current to the phase-change memory material. As the electric current passes from first electrode 120 to second electrode 160 through phase-change layer 140, at least a portion of the electric energy of the electron flow is transferred to the surrounding material as heat. That is, the electrical energy is converted to heat energy via Joule heating. The amount of electrical energy converted to heat energy increases with the resistivity of the electrical contact (and memory material) as well as with the current density (i.e., current divided by area), passing through the electrical contact and the memory material.

In the operation of memory device 100, first electrode 120 and second electrode 160 are connected to support circuitry (not shown) for programming (e.g., writing information) and reading memory device 100. The support circuitry may include the capability to program and read memory device 100 in binary mode, which provides two states, as well as a multi-level mode, which provides a variable number of states.

When combined with support circuitry, first electrode 120 is provided with a source current that flows through phase-change layer 140 to second electrode 160 through the punctured portion of resistive layer 150. Active region 145 behaves as the data storage region of the device. When active region 145 is heated and then cooled slowly, active region 145 may cool in a crystalline "set" state, which is a low resistance state. When active region 145 is heated and cooled rapidly, active region 145 may cool in an amorphous "reset" state, which is a high resistance state. The device resistance is read between electrodes 120, 160 to determine the "set" or "reset" state. Intermediate rates of cooling produce mixed crystalline-amorphous states having resistance values intermediate between the set state resistance and the reset state resistance.

Lower isolation layer 102 and capping insulator 170 prevent leakage of current from memory device 100 to surrounding structures. When a source current is provided between first electrode 120 and second electrode 160, an electrical circuit path is formed from first electrode 120 through phase-change layer 140 and to second electrode 160. Because electrodes 120, 160 are opposite each other relative to phase-change layer 140, there is a substantially direct (e.g., vertical) flow of current. That is to say, the current density of the source current is substantially vertical from first electrode 120 to second electrode 160 with minimal dispersion through phase-change layer 140 in the devices of the instant invention.

Figure 1A:
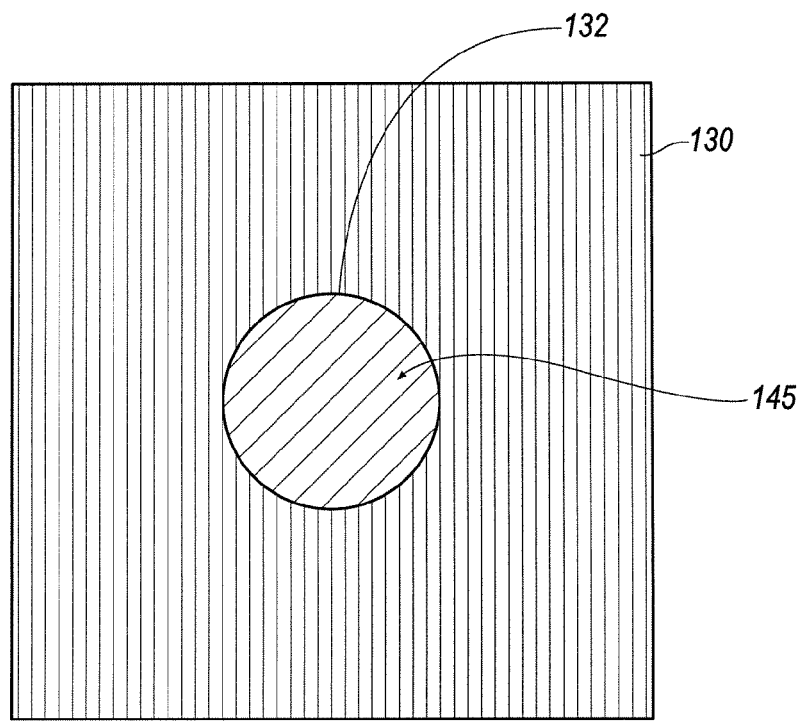
FIG. 1A is a cross-sectional view of an active material in a pore taken from section lines 1A of FIG. 1.

FIG. 1A is a cross-sectional view of first insulator 130, active region 145, and pore periphery 132 taken from section lines 1A of FIG. 1. Active region 145 is generally circular or round and is defined generally by the size and shape of pore periphery 132 (see also FIG. 1) and the location and size of the punctured portion of resistive layer 150. First insulator 130 electrically and thermally insulates phase-change layer 140 (see FIG. 1) and active region 145 from structures.

Figure 2:
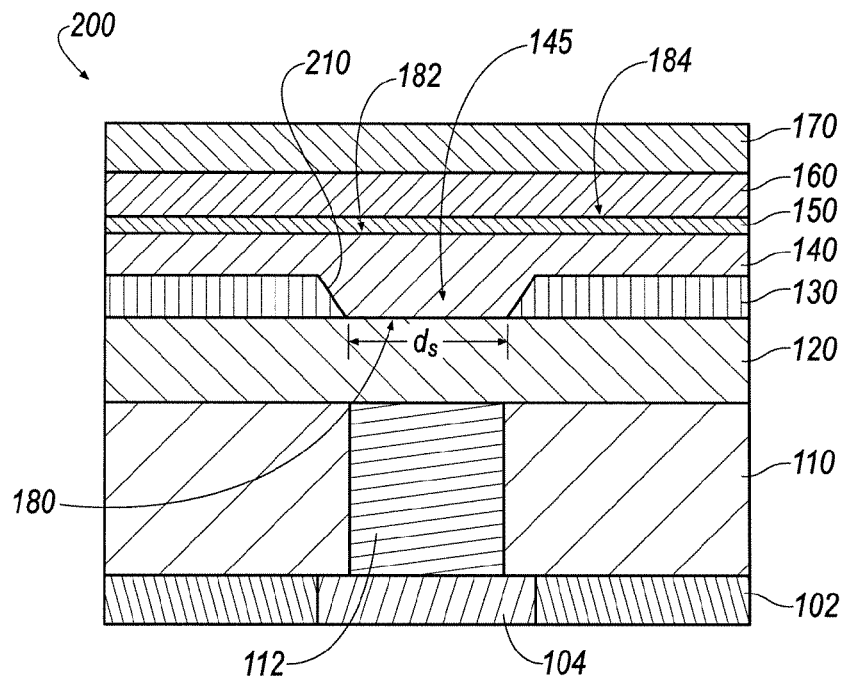
FIG. 2 is a cross-sectional view of an alternative phase-change memory device.

FIG. 2 is a cross-sectional view of an alternative phase-change memory device 200 similar to the example in FIG. 1. However, memory device 200 includes a sloped wall for a pore periphery 210. In production, parameters such as etching time, angle, etc., may be adjusted such that pore periphery 210 includes a sublithographic feature $d_s$. A sublithographic feature is a feature that is smaller than can be printed with standard photolithography. Thus, the contact area of first contact region 180 may be reduced to a sublithographic feature size. As is known in the art, sublithographic dimensions may also be achieved by forming an opening at the lithographic limit and subsequently depositing an insulating film, then anisotropically dry etching that film to form a sidewall spacer within the opening to narrow its dimensions. Such a reduction in size may be desirable, in an example, to increase the current density through phase-change layer 140 and reduce the programming volume in combination with resistive layer 150.

Figure 3:
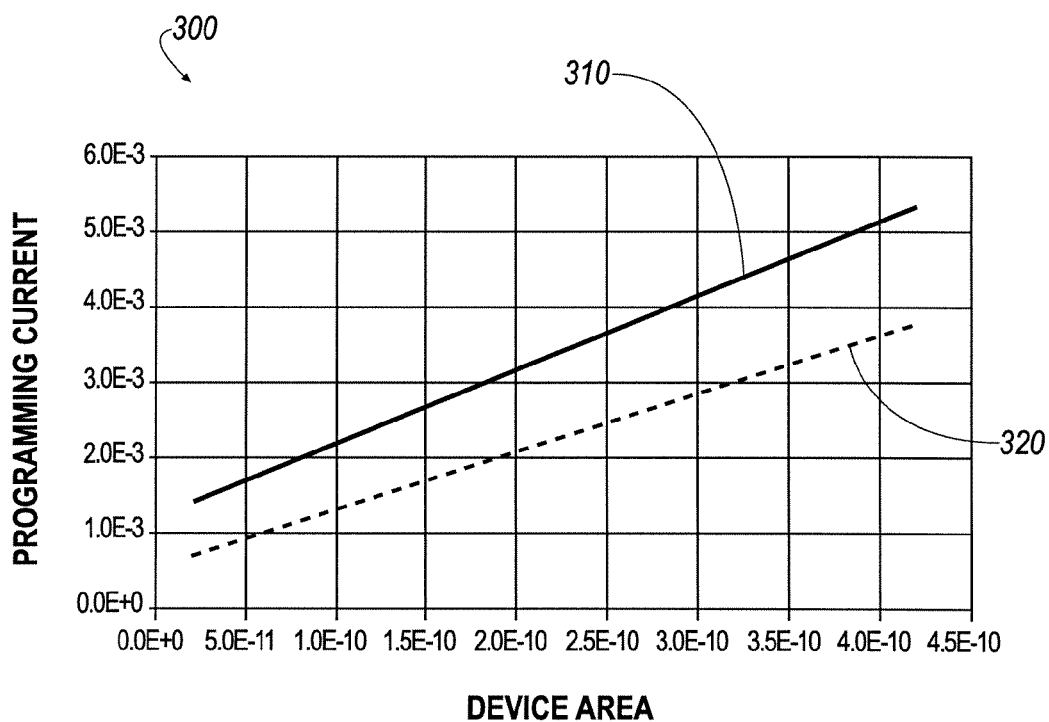
FIG. 3 is a chart illustrating differences in reset currents from a prior art memory device and the phase-change memory device of FIG. 1.

FIG. 3 is a chart 300 summarizing experimental reset current measurements taken for a phase-change memory device 100 according to FIG. 1 of the instant invention and a corresponding comparative memory device lacking resistive layer 150. The device according to the instant invention includes a 30 Å thick resistive layer 150 comprised of silicon nitride. Both the comparative device lacking resistive layer 150 and the device according to the instant invention including resistive layer 150 included a few hundred angstrom thick layer of $Ge_2Sb_2Te_5$ as phase change material 140. FIG. 3 shows the dependence of the programming current (in units of amperes) of each device as a function of the cross-sectional area (in units of square centimeters) of the pore of the device. The two experimental curves depicted in FIG. 3 are linear fits of experimental data taken for five devices having different cross-sectional areas. For each of the five cross-sectional areas, one device was prepared with a resistive layer and one device was prepared without a resistive layer. Experimental curve 310 shows the reset current of the comparative device (device without a resistive layer) and experimental curve 320 shows the reset current of the device including a resistive layer. FIG. 3 illustrates that for a given device area, the reset current for the comparative device is higher than the reset current of the device including a resistive layer in accordance with the instant invention. The reduction of reset current for the device including the resistive layer indicates a lowering of programming energy and an increase in device efficiency due to inclusion of a resistive layer in the device structure. The higher reset currents observed for the comparative device indicate greater inefficiency and energy dissipation in the comparative device.

The device area is typically represented as round structures defined at their periphery by pore diameters d and $d_s$ (see FIGS. 1-2). However, different configurations for contact region 180 and second electrode 160 are also possible. An example may be that contact region 180 may be defined by a trench or otherwise alternatively configured.

Figure 4:
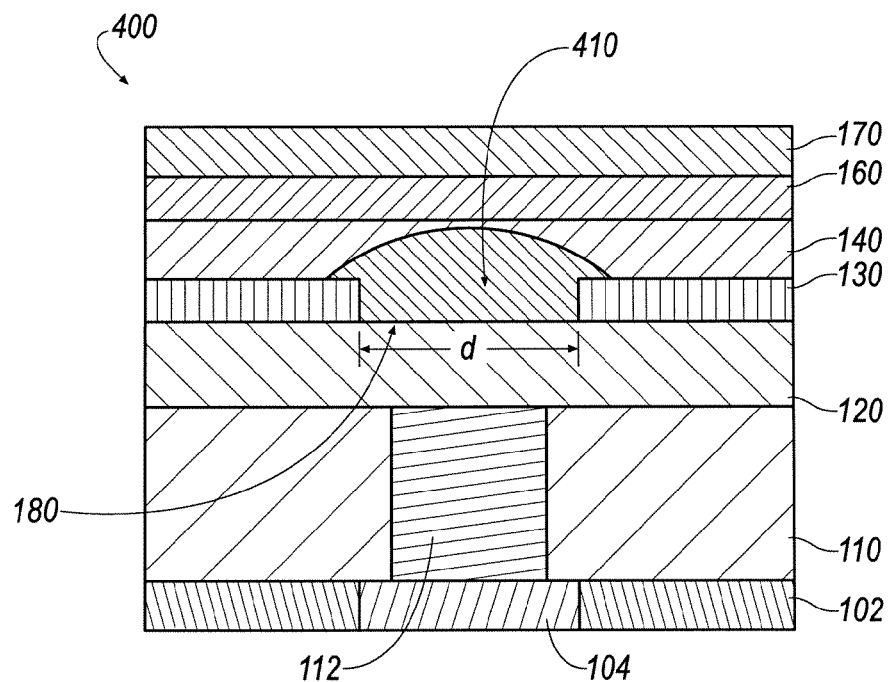
FIG. 4 is a cross-sectional view of a prior art phase-change memory device that does not include a resistive layer during a programming operation.

FIG. 4 is a cross-sectional view of a prior art phase-change memory device 400 that does not include resistive layer 150 (shown in FIG. 1) during a programming operation. A first reset volume 410 is shown where the active material (of phase-change layer 140) is heated to a viscous or liquid state. As shown, first reset volume 410 completely covers first contact region 180 and fills the pore in first insulator 130. Moreover, first reset volume 410 nearly contacts second electrode 160.

Figure 5:
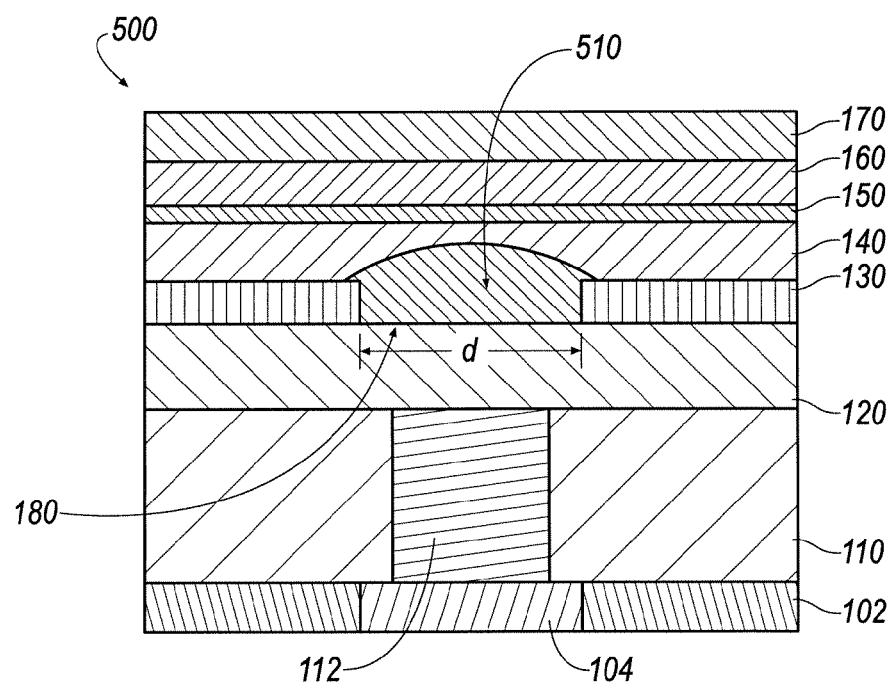
FIG. 5 is a cross-sectional view of the phase-change memory device of FIG. 1 during a programming operation.

FIG. 5 is a cross-sectional view of phase-change memory device 100 of FIG. 1 during a programming operation after resistive layer 150 has been punctured. A second reset volume 510 is reduced in volume as compared with first reset volume 410 (see FIG. 4). The amorphous volume over first contact region 180 is reduced (as shown by the reduced cross-sectional area of the amorphous regions in FIGS. 4 and 5). Thus, the volume of active material that is programmed to a new structural state is reduced and the heated active material exhibits less lateral spreading. The reduced lateral spreading distance assists in insulating active region 145 from adjacent structures. Inclusion of resistive layer 150 thus provides for better localization of the programming current and more efficient utilization of the programming energy within a smaller volume of phase change material 140.

Figure 6:
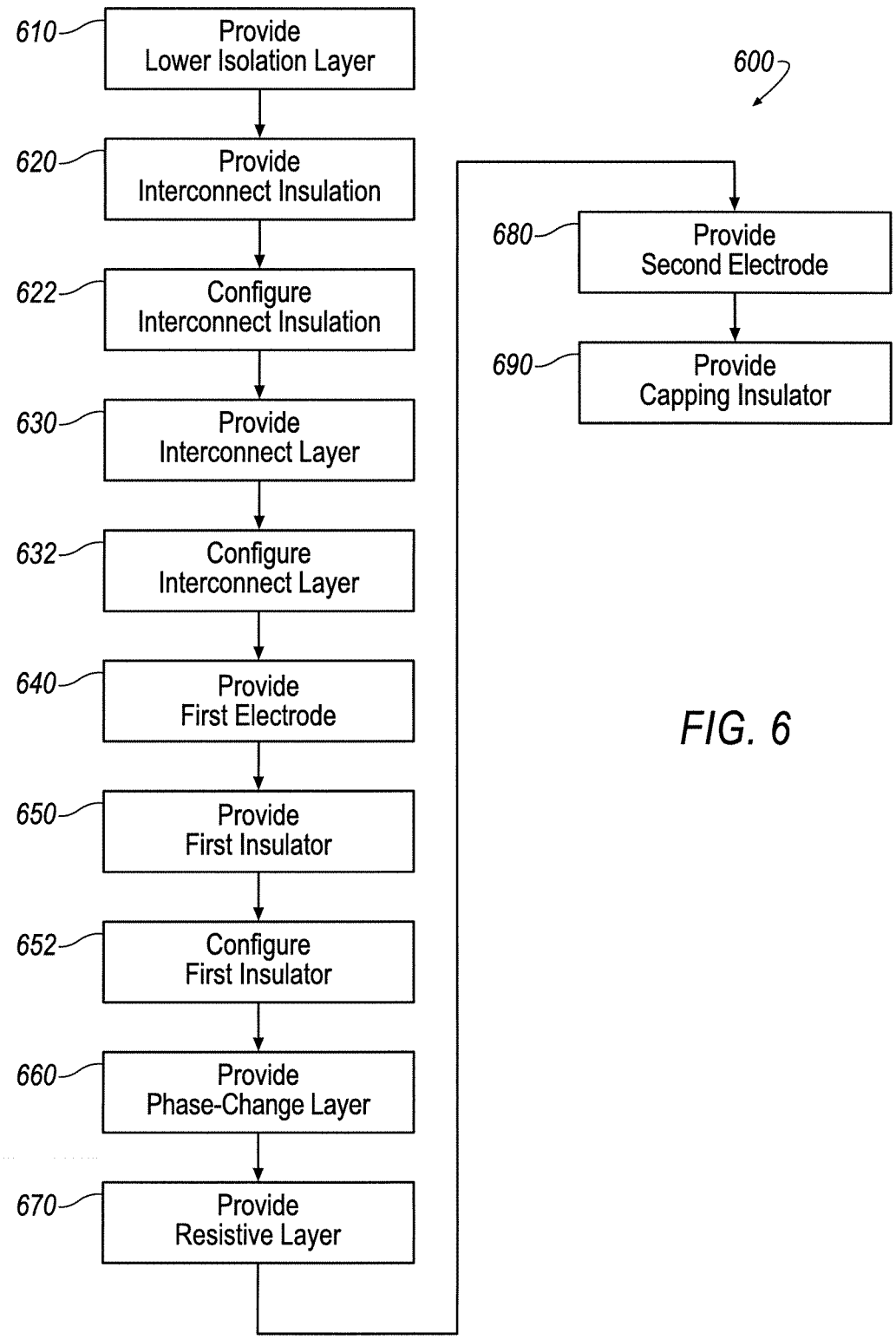
FIG. 6 is a flow diagram of the construction of the phase-change memory devices of FIGS. 1-2.

FIG. 6 is a flow diagram 600 of the construction of phase-change memory devices 100, 200 of FIGS. 1-2. Steps 610-632 are illustrative of representative processing associated with forming an underlying structure. The scope of the invention is not limited to a particular underlying structure and extends more generally to any underlying structure. In step 610, lower isolation layer 102 is provided. Lower isolation layer 102 may be made of $SiO_2$ (silicon dioxide), or other insulators, and may be deposited by techniques such as chemical vapor deposition (CVD), physical vapor deposition (PVD), or grown from a Si layer. As is known in the art, $SiO_2$ (silicon dioxide) is a common insulator in semiconductor device technology. Lower isolation layer 102 generally provides electrical and thermal isolation from any structures that memory device 100 may be constructed on top of. Further, lower isolation layer 102 may be provided on top of a wafer that includes semiconductor elements where memory device 100 is to be constructed above or within typical interconnect strata. That is to say, lower isolation layer 102 may be provided on top of a substrate that contains no circuits, partial, or complete circuits and systems that are to be used in conjunction with memory device 100. Alternatively, lower isolation layer 102 may itself be a glass or silicon wafer of suitable properties for constructing memory device 100. Lower isolation layer 102 may be etched or otherwise processed to form an opening in which lower conductive layer 104 may be formed. After forming lower conductive layer 104, the upper surface may be subjected to a CMP process to planarize the surface or remove excess amounts of the material used to form lower conductive layer 104.

Next, in step 620, lower interconnect insulator 110 is provided. Lower interconnect insulator 110 may be a $SiO_2$ (silicon dioxide), SiN (silicon nitride), or other oxide or nitride material and may be deposited by chemical vapor deposition (CVD), physical vapor deposition (PVD), or grown from a Si layer. For improved performance, lower interconnect insulator 110 may be selected for reduced thermal conductivity. Preferably, the thermal conductivity is less than that of $SiO_2$ (silicon dioxide) to provide increased retention of heat in phase-change layer 140 during programming operations.

Alternative materials for first insulator 130 may include, but are not limited to, carbide materials, nitride materials, aerogels, xerogels and their derivatives and composites. Typically, lower interconnect insulator 110 may comprise a material such as silicon dioxide ($SiO_2$) or silicon nitride ($Si_3N_4$). In a preferred embodiment, silicon dioxide ($SiO_2$) is used. In a more preferred embodiment, silicon nitride ($Si_3N_4$) is used.

Next, in step 622, lower interconnect insulator 110 is configured. An etch process is used to create patterns in the deposited insulator provided in step 620. The configured lower interconnect insulator 110 may be patterned as circular holes, square holes, trenches and/or other features.

Next, in step 630, a layer is provided that will become lower interconnect 112. Lower interconnect 112 is typically a metal such as aluminum, tungsten, or copper and may be deposited using techniques such as CVD, electroplating, sputtering or evaporation. Lower interconnect 112 may generally be made of a metal, metal alloy, metal-containing compound (e.g. Ti, TiAlN, TiSiN, TiN, MoN) or carbon and may be a homogeneous, layered, or composite material. As memory devices 100, 200 may be constructed between steps in a semiconductor process, lower interconnect 112 may be deposited along with other interconnect lines for other circuitry constructed on the substrate.

Next, in step 632, lower interconnect 112 is configured and excess material from the deposition of lower interconnect 112 is removed. Lower interconnect 112 is formed using a deposition across the entirety of the surface of lower interconnect insulator 110, into the holes formed during configuration of lower interconnect insulator 110 and over lower conductive layer 104. The excess material lying above lower interconnect insulator 110 is to be removed so that lower interconnect 112 remains only in the holes formed during configuration of lower interconnect insulator 110. The excess insulator material is removed using a chemical mechanical polishing (CMP) process. Generally, the horizontal upper surface of lower interconnect insulator 110 is cleaned by removing the excess material to provide a generally planar surface. When complete, lower interconnect 112 remains exposed for electrical communication with first electrode 120 (provided in later steps).

In an alternative embodiment, interconnect layer 112 may first be deposited over isolation layer 102 and conductive layer 104 and then configured (e.g. through masking and etching) to form a stud or pillar. Lower interconnect insulator 110 may then be formed over and around the pillar and over lower layers 102 and 104. CMP may then be performed to remove excess material of of lower interconnect insulator 110 to expose the surface of interconnect layer 112.

Next, in step 640, first electrode 120 is provided. First electrode 120 is typically a metal, metal alloy, metal-containing compound (e.g. Ti, TiAlN, TiSiN, TiN, MoN) or carbon and may be deposited by CVD, sputtering or evaporation. First electrode 120 may be a homogeneous, layered, or composite material. First electrode 120 is formed at least in part over lower interconnect 112 and may extend over part of lower interconnect insulator 110 (see FIG. 1). First electrode 120 electrically communicates with lower interconnect 112 and provides the read/write access to memory device 100. First electrode 120 may then be patterned to insure isolation of adjacent devices in an array. In an alternate embodiment, lower interconnect 112 may be used directly as the lower electrode of the device and the step of forming first electrode 120 may be omitted.

Next, in step 650, first insulator 130 is provided. First insulator 130 may be a $SiO_2$ (silicon dioxide) material and may be deposited by chemical vapor deposition (CVD), physical vapor deposition (PVD), or grown from a Silicon film. For improved performance, first insulator 130 may be selected for reduced thermal conductivity. Preferably, the thermal conductivity is less than that of $SiO_2$ (silicon dioxide) to provide increased retention of heat in phase-change layer 140 during programming operations. The alternative materials for first insulator 130 may include, but are not limited to, carbide materials, nitride materials, aerogels, xerogels and their derivatives and composites. Typically, first insulator 130 may comprise a material such as silicon dioxide ($SiO_2$) or silicon nitride ($Si_3N_4$). In a preferred embodiment, silicon dioxide ($SiO_2$) is used. In a more preferred embodiment, silicon nitride ($Si_3N_4$) is used.

Next, in step 652, first insulator 130 is configured to provide pore periphery 132. First insulator 130 was formed using a deposition across the entirety of the surface of first electrode 120. Thus, for the embodiments described above with respect to memory devices 100, 200 (of FIGS. 1 and 2), pore peripheries 132, 210 are to be formed through the layer by removing material from first insulator 130. This removal of insulator material provides that first contact region 180 is exposed. In an example, reactive ion etching (RIE) is used to open a pore through first insulator 130. When complete, first contact region 180 remains exposed for electrical communication with phase-change layer 140 (provided in a later step). The diameter of first contact region 180 may extend from tens of angstroms to several thousand angstroms.

Next, in step 660, phase-change layer 140 is provided. Typically, GST225 (discussed in detail above) is deposited in a layer. Other phase-change or switching materials may also be used as discussed above with respect to FIG. 1, including chalcogenide alloys, pnictide alloys or threshold switching alloys. The top surface of first insulator 130 is generally planer. Thus, phase-change layer 140 is provided as a substantially flat layer over the top surface of first insulator 130. However, some portion of phase-change layer 140 is deposited within pore peripheries 132, 210 (see FIGS. 1 and 2) and contacts first electrode 120 at first contact region 180. Thus, phase-change layer 140 and first electrode 120 are in electrical communication when phase-change layer 140 is deposited.

Next, in step 670, resistive layer 150 is provided over phase-change layer 140. Resistive layer 150 may include a silicon nitride ($Si_3N_4$) material that is deposited to a thickness of about 20 Å (twenty angstroms) to about 40 Å (forty angstroms) in a film. Other insulators may also be used including, but are not limited to, silicon dioxide ($SiO_2$), other oxide materials, carbide materials, nitride materials, aerogels, xerogels and their derivatives and composites. The film of resistive layer 150 may be deposited, for example, by chemical vapor deposition (CVD), physical vapor deposition (PVD) or evaporation. In addition to the electrical and thermal properties of resistive layer 150, the layer may also act as an etch-stop that is used to prevent further patterning of existing lower features in subsequent manufacturing processes.

Next, in step 680, second electrode 160 is provided. Typically, second electrode 160 is a metal, metal alloy, metal containing compound (e.g. Ti, TiAlN, TiSiN, TiN, MoN), or carbon and is deposited by CVD, sputtering or evaporation. Second electrode 160 may be a homogeneous, layered, or composite material. When deposited, second electrode 160 includes a layer that electrically communicates with phase-change layer 140. Second electrode 160, resistive layer 150, and phase-change layer 140 may be further patterned to separate memory devices 100, 200 from adjacent memory devices when produced in an array.

Next, in step 690, capping insulator 170 is provided to isolate memory devices 100, 200 electrically and thermally from other circuits or structures that may be constructed over memory devices 100, 200. Capping insulator 170 may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. An electronic device comprising:
    a first electrode having an upper surface and a lower surface, wherein the upper surface of the first electrode includes a first upper surface portion and a second upper surface portion;
    an insulator having an upper surface, a lower surface and an inner sidewall surface connecting the upper surface of the insulator to the lower surface of the insulator, wherein the lower surface of the insulator is disposed adjacent the first upper surface portion of the first electrode, wherein the inner sidewall surface of the insulator defines a pore passage that extends through the insulator such that the lower surface of the insulator does not contact the second upper surface portion of the first electrode;
    an active material having an upper surface, a first lower surface portion, a second lower surface portion and an outer sidewall surface portion connecting the first lower surface portion to the second lower surface portion, wherein the first lower surface portion of the active material is disposed adjacent the upper surface of the insulator, wherein the second lower surface portion of the active material is disposed adjacent the second surface portion of the upper surface of the first electrode, wherein the outer sidewall surface portion of the active material is disposed adjacent the inner sidewall surface portion of the insulator;
    a dielectric material having an upper surface and a lower surface, wherein the lower surface of the dielectric material is disposed adjacent the upper surface of the active material; and
    a second electrode having an upper surface and a lower surface, wherein the lower surface of the second electrode is disposed adjacent the upper surface of the dielectric material.

2. The electronic device of claim 1, wherein the outer sidewall surface portion and the second lower surface portion of the active material forms
    a projection of the active material that extends away from the first lower surface portion of the active material, wherein the projection is disposed within the pore passage of the insulator.

3. The electronic device of claim 2, wherein the inner sidewall surface of the insulator defining the pore passage is substantially perpendicular with respect to the upper surface of the first electrode thereby forming the pore passage to include a constant diameter through a thickness of the insulator from the lower surface of the insulator to the upper surface of the insulator, wherein the projection includes a dimension that corresponds to the constant diameter of the pore passage.

4. The electronic device of claim 2, wherein the inner sidewall surface of the insulator defining the pore passage is non-perpendicular with respect to the upper surface of the first electrode thereby forming the pore passage to include a non-constant diameter through a thickness of the insulator from the lower surface of the insulator to the upper surface of the insulator, wherein the projection includes a dimension that corresponds to the non-constant diameter of the pore passage.

5. The electronic device of claim 2, wherein the projection disposed within the pore passage of the insulator forms
    an active region of the electronic device.

6. The electronic device of claim 5, wherein the active region permits current to pass from the first electrode through the active material and to the second electrode.

7. The electronic device of claim 2, wherein the dielectric material includes a puncture region having a selectively-variable dimension to provide, during a programming operation a reduction of heated and viscous amorphous volume of the active material over the second upper surface portion of the first electrode and a reduction of lateral spreading of the heated and viscous amorphous volume of the active material.

8. The electronic device of claim 7, wherein the reducing of the lateral spreading of the heated and viscous amorphous volume of the active material provides:

insulation of the active region from the first electrode and the second electrode, localized programming current during the programming operation, and increased efficiency of programming energy during the programming operation.

9. The electronic device of claim 7, wherein the selectively-variable dimension of the puncture region permits:

selective-exposing of an amount of the lower surface of the second electrode to the upper surface of the first electrode in response to an adjustment of a voltage applied between the first electrode and the second electrode for controlling a heated and viscous amorphous volume of the active material between the first electrode and the second electrode for controlling a reset current of the electronic device.

10. The electronic device of claim 7, wherein the punctured region of the dielectric material includes a dimension that is less than a dimension of the pore passage of the insulator.

11. The electronic device of claim 7, wherein the punctured region of the dielectric material includes a cross-sectional dimension of less than 1000 Å.

12. The electronic device of claim 7, wherein the punctured region of the dielectric material includes a cross-sectional dimension of less than 300 Å.

13. The electronic device of claim 7, wherein the punctured region of the dielectric material includes a cross-sectional dimension of less than 100 Å.

14. The electronic device of claim 7, wherein the punctured region of the dielectric material includes a dimension that is less than a dimension of an area of contact defined by the second lower surface portion of the active material disposed adjacent the second surface portion of the upper surface of the first electrode.

15. The electronic device of claim 7, wherein the punctured region of the dielectric material includes a dimension that is less than 50% of an area of contact defined by the second lower surface portion of the active material disposed adjacent the second surface portion of the upper surface of the first electrode.

16. The electronic device of claim 7, wherein the punctured region of the dielectric material includes a dimension that is less than 25% of an area of contact defined by the second lower surface portion of the active material disposed adjacent the second surface portion of the upper surface of the first electrode.

17. The electronic device of claim 1, wherein the pore passage forms a sublithographic dimension.

18. The electronic device of claim 1, wherein the dielectric material includes a thickness of between approximately about 20 Å and 40 Å.

19. The electronic device of claim 1, wherein the dielectric material is selected from the group consisting of silicon, nitrogen or oxygen.

20. The electronic device of claim 1, further comprising a bottom interconnect having an upper surface and a lower surface, wherein the upper surface of the bottom interconnect is disposed adjacent the lower surface of the first electrode.

21. The electronic device of claim 1, wherein said active material includes a phase-change material, wherein the phase-change material is selected from the group consisting of a chalcogenide material and a pnictide material.

22. The electronic device of claim 1, wherein said active material includes a switching material, wherein the switching material is selected from the group consisting of a chalcogenide material and a pnictide material, wherein the switching material remains amorphous under current and voltage conditions that are used to induce a switching transformation.

23. An electronic device comprising:

an active material;

a first electrode in direct contact with said active material, wherein said direct contact of said first electrode with said active material defines a contact surface area having a first dimension;

a first layer in direct contact with said active material, said first layer including a punctured region, wherein said punctured region includes a first cross-sectional area having a second dimension;

a second electrode in direct contact with said first layer, said second electrode covering said punctured region;

wherein said active material includes a second cross-sectional area having a third dimension, wherein said second cross-section area is located at a position between said first cross-sectional area and the contact surface area, wherein said third dimension of said second cross-sectional area is greater than said second dimension of said first cross-sectional area and said first dimension of said contact surface area.

24. The electronic device of claim 23, wherein a dimension formed by the direct contact of said second electrode and said first layer is greater than a dimension formed by the direct contact of said first electrode and said active material.

25. An electronic device comprising:

a first electrode;

a first dielectric material in direct contact with said first electrode, said first dielectric material including an opening, said opening exposing said first electrode, said opening forms a first cross-sectional dimension;

an active material in direct contact with said first dielectric material, said active material occupying said opening and directly contacting said first electrode;

a second dielectric material in direct contact with said active material, said second dielectric material including a punctured region, said punctured region having a second cross-sectional dimension; and a second electrode in direct contact with said second dielectric material, said second electrode covering said punctured region.

26. The electronic device of claim 25, wherein said second dielectric material is spaced apart from said first dielectric material.

27. The electronic device of claim 25, wherein a dimension formed by the direct contact of said second electrode with said second dielectric material is greater than a dimension formed by said first cross-sectional dimension.

* * * * *